United States Patent
Roh et al.

(10) Patent No.: US 6,346,897 B1
(45) Date of Patent: Feb. 12, 2002

(54) N:N+1 CHANNEL CODING METHOD AND APPARATUS THEREFOR

(75) Inventors: Jae-Woo Roh; Kun Yul Kim; Euiseok Hwang, all of Seoul (KR)

(73) Assignee: Daewoo Electronics Co., Ltd., Seoul (KR)

( * ) Notice: Subject to any disclaimer, the term of this patent is extended or adjusted under 35 U.S.C. 154(b) by 0 days.

(21) Appl. No.: 09/707,236

(22) Filed: Nov. 6, 2000

(30) Foreign Application Priority Data

Jul. 4, 2000 (KR) .......................................... 00-37979

(51) Int. Cl.⁷ .............................................. H03M 7/00
(52) U.S. Cl. ......................................... 341/106; 341/65
(58) Field of Search ........................................ 341/106

(56) References Cited

U.S. PATENT DOCUMENTS 5,739,779 A * 4/1998 Kunisa et al. ................ 341/59
5,920,272 A * 7/1999 Schouhamer-Immink ... 341/59
6,240,213 B1 * 5/2001 Cho ............................ 382/245

* cited by examiner

*Primary Examiner*—Peguy JeanPierre
*Assistant Examiner*—Joseph J Lauture
(74) *Attorney, Agent, or Firm*—Anderson Kill & Olick; Eugene Lieberstein; Michael Meller (57) ABSTRACT

A method for mapping $2^N$ message N-tuples into $2^{N+1}$ codeword (N+1)-tuples is developed. The $2^{N+1}$ codeword (N+1)-tuples are categorized into M subsets of codeword (N+1)-tuples, wherein M is an integer larger than 1, each subset G has $N_G$ codeword (N+1)-tuples and the total number of codeword (N+1)-tuples in the M subsets is $2^N$. Each subset G has a predetermined number $K_G$ of lower bits and a predetermined number $(N+1-K_G)$ of higher bits, and the number of lower bits in every codeword (N+1)-tuple in any subset is not equivalent to that of lower bits in every codeword (N+1)-tuple in any other subset. The $2^N$ message N-tuples are matched with the $2^N$ codeword (N+1)-tuples in the M subsets, respectively, in one-to-one correspondence to generate a lookup table.

16 Claims, 4 Drawing Sheets

N:N+1 CHANNEL CODING METHOD AND APPARATUS THEREFOR

FIELD OF THE INVENTION

The present invention relates to an N:N+1 channel coding method and apparatus therefor; and, more particularly, to a method and apparatus capable of encoding binary data and decoding transmitted codeword data by using an N:N+1 channel coding algorithm with a higher code rate.

BACKGROUND OF THE INVENTION

As is well known, demands for optically storing a large amount of data, such as data for a motion picture film, have been increasing. Therefore, various types of volume holographic data storage(VHDS) systems incorporating therein a storage medium have been recently developed for realizing high density optical storage capabilities.

In the VHDS system, source data are segmented into blocks of N data bits, which are also called information bits or message bits, each block capable of representing any of $2^N$ distinct messages. An encoder in the VHDS system transforms each N-bit data block into a larger block of (N+K) bits, called code bits or channel symbols. The K bits, which the encoder adds to each data block, are called redundant bits, parity bits or check bits: they carry no new information. The code is referred to as an (N+K, N) code. The ratio of redundant bits to data bits, K/N, within a block is called redundancy of the code, and the ratio of data bits to total bits, N/(N+K), is called a code rate. The code rate may be thought of as the portion of a code bit that constitutes information. For example, in a rate 1/3 code, each code bit carries 1/3 bit of information. If for example, an error control technique employs a rate 1/3, the redundancy is 2/3 and the bandwidth expansion is only 3.

In other words, the encoder transforms a block of N message digits (a message vector) into a longer block of N+K codeword digits (a code vector), constructed from a given alphabet of elements. When the alphabet consists of two elements (0 and 1), the code is a binary code comprised of binary digits (bits). The explanation provided therein will be confined to binary codes, unless otherwise noted.

The N-bit message forms $2^N$ distinct message sequences referred to as N-tuples (sequences of N digits). The (N+K)-bit blocks can form as many as $2^{N+K}$ distinct sequences, referred to as (N+K)-tuples. The encoding procedure assigns to each of the $2^N$ message N-tuples one of the $2^{N+K}$ (N+K)-tuples. A block code represents a one-to-one assignment, whereby the $2^N$ message N-tuples are uniquely mapped into a new set of $2^N$ codeword (N+K)-tuples; and the mapping can be accomplished via a look-up table.

In the decoding mode, a multiplicity of decoding algorithms has been used in order to increase the code rate while decreasing the bit error rate.

In a threshold decoding algorithm, a threshold, e.g., an average value or a predetermined value such as 0.5, may be used to assign '0' or '1' to a retrieved or transmitted signal disturbed by channel distortion. In the conventional VHDS system, Gaussian distribution characteristics of a laser beam, lens distortions, scattering and diffraction in the system and so on may be appreciated as a channel. The threshold decoding algorithm has a higher code rate, but also has a higher bit error rate, specifically, with a lower intensity of laser beam.

An improvement may be realized by using a local threshold decoding algorithm. The local threshold decoding algorithm divides a decoding region into a plurality of local regions and applies a different threshold for each local region so as to determine '0' or '1'. The local threshold decoding algorithm has a low compatibility because each of the VHDS systems has intrinsic noise patterns different from each other.

Another improvement may be realized by using a binary differential decoding algorithm. The binary differential decoding algorithm uses a characteristic that a signal for representing '1' is always larger than a signal for representing its nearest '0'. For example, '0' and '1' are replaced with '01' and '10', respectively, to be encoded and its reverse algorithm is used to decode a transmitted signal. The binary differential decoding algorithm has a lower bit error rate, but its code rate is also comparatively decreased.

Another improvement may be achieved by employing a balanced block decoding algorithm. The balanced block decoding algorithm divides an input message into a plurality of message P-tuples and each message P-tuple is encoded with a codeword 2Q-tuple, wherein the number of lower bits is equal to that of higher bits, 2Q being larger than P. In a decoding mode, a transmitted signal is divided into a plurality of codeword 2Q-tuples; and Q number of lower and higher bits for each codeword 2Q-tuple are reconstructed as '0' and '1', respectively. For example, in a 6:8 balanced block decoding algorithm only $2^6(=64)$ codeword 8-tuples which have the same number, i.e., 4 of lower and higher bits among $2^8(=256)$ codeword 8-tuples are selected to encode 64 message 6-tuples. The balanced block coding algorithm has a lower bit error rate and a higher code rate than the binary differential coding algorithm; however, a still higher code rate is required to use a limited channel resource effectively.

SUMMARY OF THE INVENTION

It is, therefore, an object of the present invention to provide a method and apparatus capable of encoding binary data and decoding transmitted codeword data by using an N:N+1 channel coding algorithm with a much increased code rate with a reduced bit error rate.

In accordance with a preferred embodiment of the present invention, there is provided a method for mapping $2^N$ message N-tuples into $2^{N+1}$ codeword (N+1)-tuples, wherein said each of N-tuples and (N+1)-tuples is a binary code comprised of bits, 0 and 1, comprising the steps of:

(a) categorizing the $2^{N+1}$ codeword (N+1)-tuples into M subsets of codeword (N+1)-tuples, wherein M is an integer larger than 1, each subset G has $N_G$ codeword (N+1)-tuples, $N_G$ being a positive integer, and the total number of codeword (N+1)-tuples in the M subsets is $2^N$ given as follows:

$$\sum_{G=1}^{M} N_G = 2^N,$$

is wherein the each subset G has a predetermined number $K_G$ of lower bits and a predetermined number $(N+1-K_G)$ of higher bits and the number of lower bits in every codeword (N+1)-tuple in any subset is not equivalent to that of lower bits in every codeword (N+1)-tuple in any other subset; and (b) matching the $2^N$ message N-tuples with the $2^N$ codeword (N+1)-tuples in the M subsets, respectively, in one-to-one correspondence to generate a lookup table.

BRIEF DESCRIPTION OF THE DRAWINGS

The above and other objects and features of the present invention will become apparent from The following description of preferred embodiments given in conjunction with the accompanying drawings, in which.

DETAILED DESCRIPTION OF THE PREFERRED EMBODIMENTS

Figure 1:
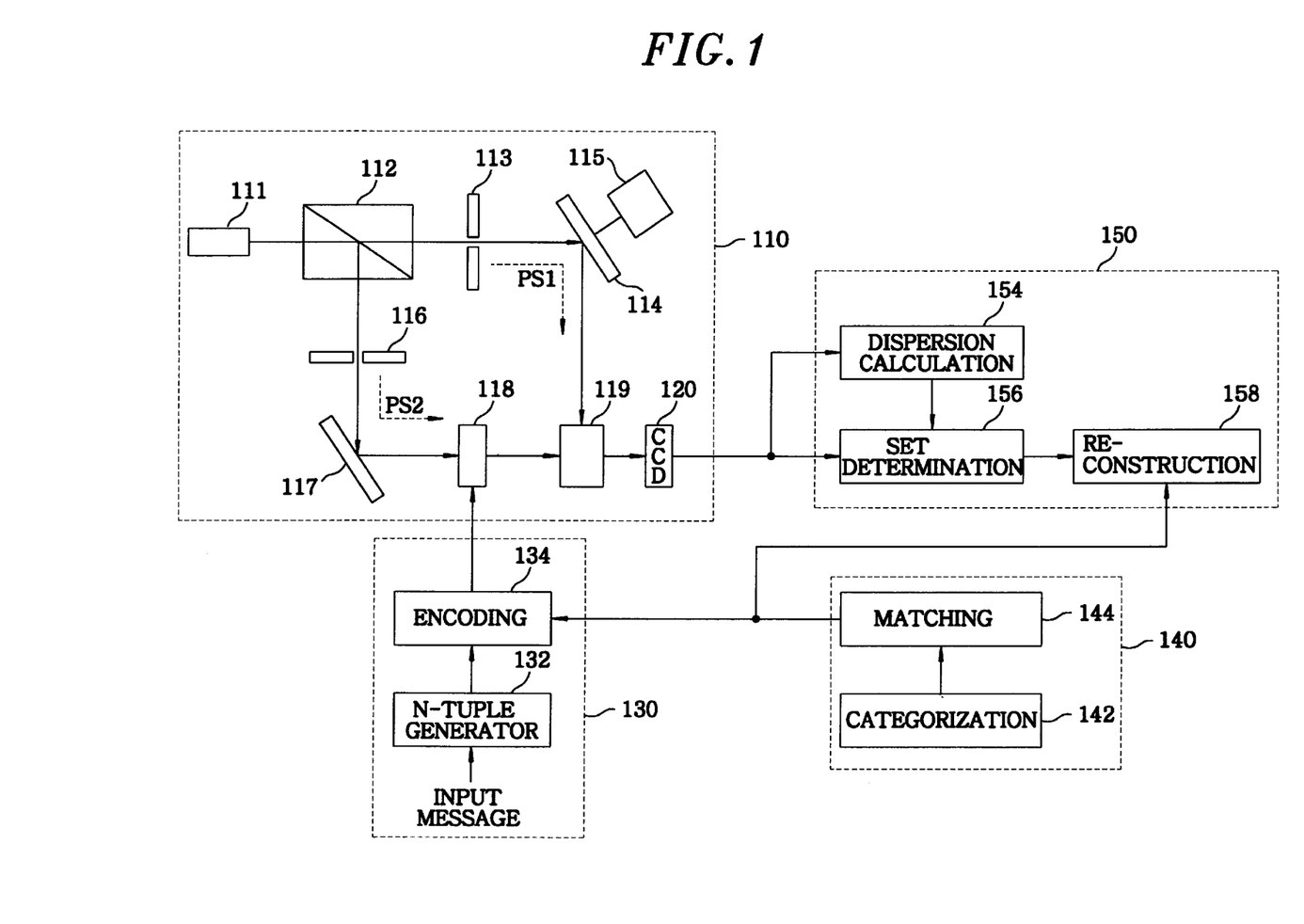
FIG. 1 represents a block diagram for illustrating a holographic digital encoding and decoding system in accordance with the present invention.

Referring to FIG. 1, there is shown a block diagram for illustrating a holographic digital encoding and decoding system in accordance with a preferred embodiment of the present invention, wherein the system comprises a holographic data storage (HDS) circuit 110, an encoding circuit 130, a lookup table generator 140 and a decoding circuit 150. Specifically, the HDS system 110 has a laser 111, a beam splitter 112, a first and a second shutter 113 and 116, a first and a second mirror 114 and 117, an actuator 115, a spatial light modulator(SLM) 118, a storage medium 119 and a charge coupled device(CCD) 120. The encoding circuit 130 has an N-tuple generator 132 and a encoding unit 134. The lookup table generator 140 has a categorization unit 142 and a matching unit 144. The decoding circuit 150 has a dispersion calculation unit 154, a set determination unit 156 and a reconstruction unit 158.

In the HDS system 110, a laser beam emitted from the laser 111 impinges onto the beam splitter 112 which is capable of partially reflecting the laser beam to thereby obtain a reference and a signal beam, wherein the reference beam is a portion of the laser beam transmitted through the beam splitter 112 and the signal beam is a remaining portion of the laser beam reflected from the beam splitter 112.

The reference beam enters into the storage medium 119 through a reference beam path (PS1) after being reflected by the first mirror 114 controlled by the actuator 115. In the meantime, the signal beam enters into the SLM 118 which converts the signal beam impinged thereonto into a modulated signal beam through a signal beam path (PS2) after being reflected by the second mirror 117, wherein the modulated signal beam carries data in the form of pages after passing through the SLM 118. The modulated signal beam is focused on the storage medium 119. In the storage medium 119, the modulated signal beam interferes with the reference beam to thereby generate an interference pattern therebetween, wherein the interference pattern contains information of the modulated signal beam. The interference pattern is converted to an optical index pattern in the storage medium 119 whose refractive index changes in response to the interference pattern to thereby record the modulated signal beam into the storage medium 119.

To read the stored data, only the first shutter 113 remains open while the second shutter 116 turns to be closed so that the modulated signal beam retrieved from the storage medium 119 enters the CCD 120 which is capable of detecting the power of the retrieved signal beam. The retrieved signal beam is generated by diffraction of the reference beam from the storage medium 119.

In the meantime, the categorization unit 142 for implementing an N:N+1 encoding algorithm in the lookup table generator 140 selects M subsets of codeword (N+1)-tuples among $2^{N-1}$ codeword (N+1)-tuples, wherein information on the M subsets of codeword (N+1)-tuples is transferred to the matching unit 144.

M is an integer larger than 1 and preferably an even integer. Each subset G has a predetermined number $K_G$ of lower binary digits and a predetermined number $(N+1-K_G)$ of higher binary digits. The number of lower binary digits in every codeword (N+1)-tuple in any subset is not equivalent to that of lower binary digits in every codeword (N+1)-tuple in any other subset.

If each subset G has $N_G$ number of codeword (N+1)-tuples, $N_G$ being a positive integer, the total number of codeword (N+1)-tuples in the M subsets must be $2^N$. In other word, $$\sum_{G=1}^{M} N_G = 2^N.$$

It is preferable that the number $N_G$ is equal to $2^N/M$. The matching unit 144 matches the $2^N$ message N-tuples with the $2^N$ codeword (N+1)-tuples in the M subsets in one-to-one correspondence to generate a lookup table between $2^N$ message N-tuples and the $2^N$ codeword (N+1)-tuples. The lookup table is shared with the encoding unit 134 and the reconstruction unit 158.

In the meantime, the N-tuple generator 132 receives input message and sequentially divides the input message into a plurality of message N-tuples. The plurality of message N-tuples are provided to the encoding unit 134.

The encoding unit 134 encodes each message N-tuple in the plurality of message N-tuples with its corresponding codeword (N+1)-tuple based on the lookup table to generate a plurality of codeword (N+1)-tuples. The plurality of codeword (N+1)-tuples are transmitted to the SLM 118 which converts the signal beam impinged thereonto into a modulated signal beam. The modulated signal beam is focused on the storage medium 119. In the storage medium 119, the modulated signal beam interferes with the reference beam to thereby generate the interference pattern therebetween as described above.

To read the stored data, the modulated signal beam retrieved from the storage medium 119 enters the CCD 120 which is capable of detecting the power of the retrieved signal beam. The SLM 118, the storage medium 119 and the CCD 120 may be appreciated as a channel. The retrieved signal beam is transmitted to the dispersion calculation unit 154 and the set determination unit 156 as a plurality of transmitted codeword (N+1)-tuples. Each transmitted codeword (N+1)-tuple has been disturbed by internal and external noises during a transmitted process through the channel so that it may be represented by (N+1) decimals.

The dispersion calculation unit 154 calculates a dispersion for (N+1) decimals of each codeword (N+1)-tuple. Firstly, a least number L of higher and lower bits in M subsets of codeword (N+1)-tuples is calculated and a greatest number K is computed from the least number L and the subset number M. Specifically, the greatest number K is a maximum value of the least number L and the ceiling of $Log_2 M$, i.e., $\lceil Log_2 M \rceil$. Maximum or minimum decimals as many as the greatest number K are deleted in (N+1) decimals so that (N+1−K) decimals may be obtained for each transmitted codeword (N+1)-tuple. An (N+1−K)th dispersion for the (N+1−K) decimals is calculated by using a conventional dispersion calculation method to obtain a plurality of (N+1−K)th dispersions for a plurality of transmitted codeword (N+1)-tuples. If necessary, other dispersions may be calculated by changing the greatest number K. If the subset number M is larger than 2, additional dispersion is required. Information on the dispersions is delivered to the set determination unit 156.

The set determination unit 156 determines which subset G corresponds to the transmitted codeword (N+1)-tuple based on the information on the dispersions. Specifically, an (N+1−K)th average dispersion for the plurality of (N+1−K) th dispersions is calculated and each (N+1−K) dispersion is compared with the (N+1−K)th average dispersion. The subset G corresponding to the transmitted codeword (N+1)-tuple may be determined based on the dispersion comparison result.

The reconstruction unit 158 reconstructs a reconstructed codeword (N+1)-tuple based on information on the subset G. Specifically, a predetermined number $K_G$ of lower decimals in the transmitted codeword (N+1)-tuple are converted into the lower binary digit and a predetermined number (N+1−$K_G$) of higher decimals are converted into the higher binary digit. A reconstructed message N-tuple is assigned for the reconstructed codeword (N+1)-tuple based on the lookup table delivered from the matching unit 144.

Figure 2A:
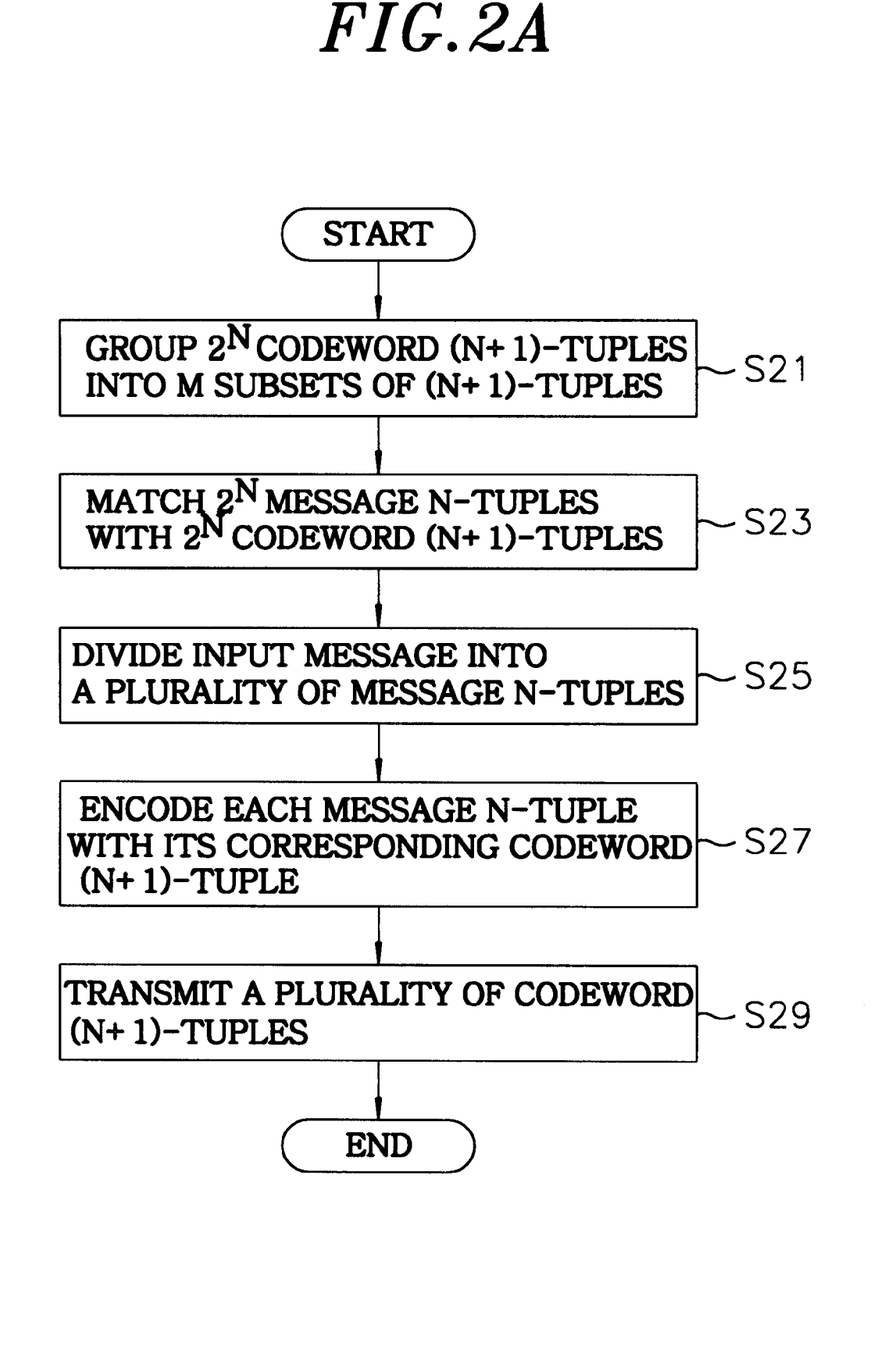
FIG. 2A shows a flow chart for illustrating an encoding algorithm for encoding a message N-tuple into a codeword (N+1)-tuple in accordance with the present invention.

Referring to FIG. 2A, there is shown a flow charl for illustrating an encoding algorithm for encoding a message N-tuple into a codeword (N+1)-tuple in accordance with the present invention.

At step S21, M subsets of (N+1)-tuples are selected among $2^{N+1}$ codeword (N+1)-tuples. M is an integer larger than 1 and preferably an even integer. Each subset G has a predetermined number $K_G$ of lower binary digits and a predetermined number (N+1−$K_G$) of higher binary digits. The number of lower binary digits in every codeword (N+1)-tuple in any subset is not equivalent to that of lower binary digits in every codeword (N+1)-tuple in any other subset. For example, $2^4$(=16) codeword 4-tuples may be categorized into 5 subsets of 4-tuples, i.e., {0000}, {0001, 0010, 0100, 1000}, {0011, 0101, 1001, 0110, 1010, 1100}, {0111, 1011, 1101, 1110} and {1111}, based on the number of '0's or '1's.

If each subset G has $N_G$ number of codeword (N+1)-tuples, $N_G$ being a positive integer, the total number of codeword (N+1)-tuples in the M subsets must be $2^N$. In other word, $$\sum_{G=1}^{M} N_G = 2^N.$$

It is preferable that the number $N_G$ is equal to $2^N/M$. Therefore, in order to use 2 subsets of codeword 4-tuples in 3:4 encoding process, the number $N_G$ of codeword 4-tuples in each subset is preferably 4(=$2^3/2$) so that two subsets are preferably selected among three subsets having at least 4 4-tuples, i.e., {0001, 0010, 0100, 1000}, {0011, 0101, 1001, 0110, 1010, 1100} and {0111, 1011, 1101, 1110}.

At step S23, the $2^N$ message N-tuples are matched with the $2^N$ codeword (N+1)-tuples in the M subsets in one-to-one correspondence to generate a lookup table between $2^N$ message N-tuples and the $2^N$ codeword (N+1)-tuples.

At step S25, input message is sequentially divided into a plurality of message N-tuples.

At step S27, each message N-tuple in the plurality of message N-tuples is encoded with its corresponding codeword (N+1)-tuple based on the lookup table sequentially and, at step S29, a plurality of codeword (N+1)-tuples are transmitted through a channel.

Figure 2B:
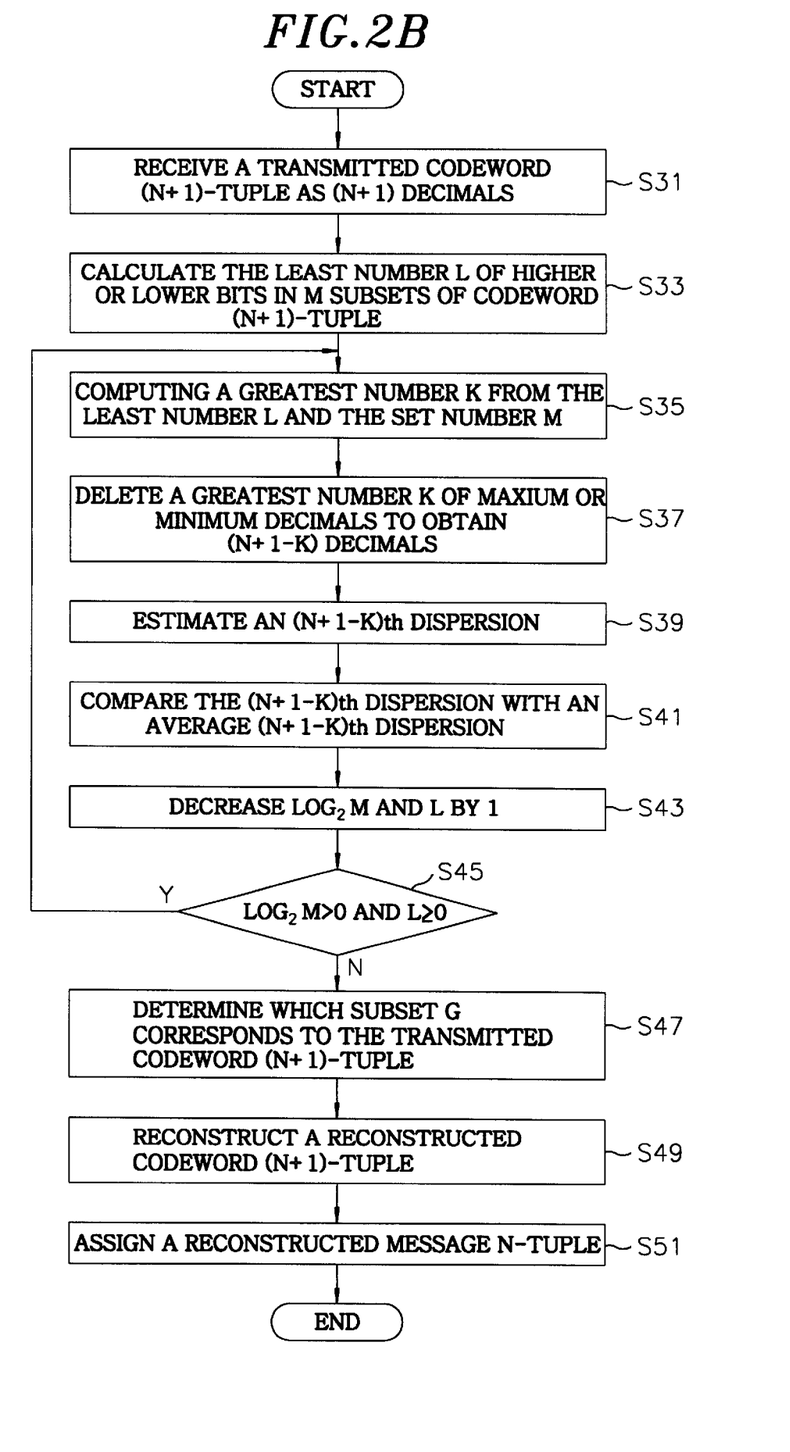
FIG. 2B describes a flow chart for illustrating a decoding process for decoding a transmitted codeword (N+1)-tuple into a reconstructed message N-tuple in accordance with the present invention.

Referring to FIG. 2B, there is shown a flow chart for illustrating a decoding process for decoding a transmitted codeword (N+1)-tuple into a reconstructed message N-tuple in accordance with the present invention.

At step S31, a plurality of transmitted codeword (N+1)-tuples are sequentially received. Each transmitted codeword (N+1)-tuple has disturbed by internal and external noises during a transmitted process through the channel so that it may be represented by (N+1) decimals.

At step S33, the least number L of higher and lower bits in M subsets of codeword (N+1)-tuples is calculated, wherein M subsets of codeword (N+1)-tuples have been selected in $2^{N+1}$ codeword (N+1)-tuples as described at step S21. When M subsets of codeword (N+1)-tuples are determined, the least number L is concurrently defined arid delivered to both the encoding circuit 130 and the decoding circuit 150 in accordance with the present invention. For each codeword 4-tuple in a subset {0001, 0010, 0100, 1000}, for example, the number of higher bits and the number of lower bits are 1 and 3, respectively, so that the least number L is 1.

At step S35, a greatest number K is computed from the least number L and the subset number M. Specifically, the greatest number K is a maximum value of the least number L and the ceiling of $Log_2M$, i.e., $\lceil Log_2M \rceil$. If the least number L is 1 and the subset number M is 4, $\lceil Log_2 4 \rceil$=2 so that the greatest number K is 2.

At step S37, maximum or minimum decimals as many as the greatest number K are deleted in (N+1) decimals so that (N+1−K) decimals may be obtained for each transmitted codeword (N+1)-tuple. If K is 1 and 4 decimals of a transmitted codeword 4-tuple are {0.1, 0.3, 0.6, 0.2}, then 0.6 is deleted to obtain 3 decimals {0.1, 0.3, 0.2}.

At step S39, an (N+1−K)th dispersion for tne (N+1−K) decimals is calculated by using a conventional dispersion calculation method to obtain a plurality of (N+1−K)th dispersions for a plurality of transmitted codeword (N+1)-tuples.

At step S41, an (N+1−K)th average dispersion for the plurality of (N+1−K)th dispersions is calculated and each (N+1−K)th dispersion is compared with the (N+1−K)th average dispersion. Specifically, it is determined whether each (N+1−K)th dispersion is larger than the (N+1−K)th average dispersion or not.

At stop S43, $Log_2M$ and the least number L are decreased by 1. In other word, $Log_2M$ and L are replaced with $Log_2M$-1 and L-1, respectively.

At step S45, it is determined if $Log_2M$ is larger than 0 and the least number L is larger than or equal to 0. If $Log_2M$>0 and L≧0, the process goes back to step S35 and, if otherwise, the process goes to step S47.

At step S47, it is determined which subset G corresponds to the transmitted codeword (N+1)-tuple based on the dispersion comparison result obtained at step S41.

At step S49, in order to reconstruct a reconstructed codeword (N+1)-tuple based on information on the subset G determined at step S47, a predetermined number $K_G$ of lower decimals in the transmitted codeword (N+1)-tuple are converted into a lower binary digit and a predetermined number (N+1−$K_G$) of higher decimals are converted into a higher binary digit.

At step S51, a reconstructed message N-tuple is assigned for the reconstructed codeword (N+1)-tuple based on the lookup table.

Figure 3:
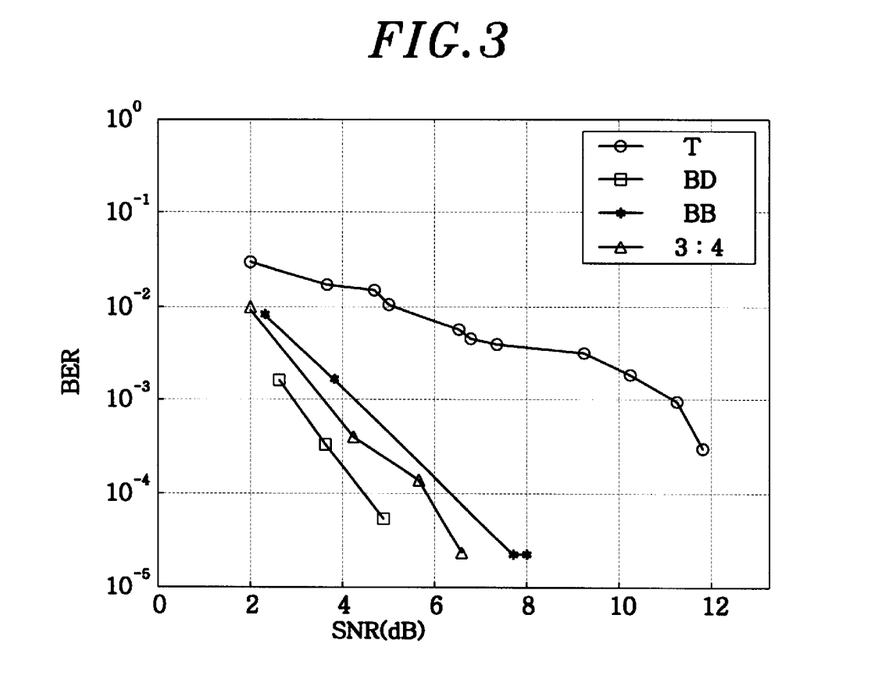
FIG. 3 provides a graph for relations between signal-to-noise ratio (SNR) to bit error rate (BER) of various channel decoding algorithms.

Referring to FIG. 3, there is shown a graph for relations between signal-to-noise ratio (SNR) and bit error rate (BER) of various channel decoding algorithms. The threshold decoding algorithm, the binary differential decoding algorithm, the balanced block decoding algorithm and the 3:4 channel decoding algorithm in accordance with the present invention are illustrated as T, BD, BB and 3:4, respectively. The SNR represents a degree of separability between higher bit and lower bit. and is calculated as follows:

$$SNR = \frac{\rho_w - \rho_b}{\sqrt{\sigma_w^2 + \sigma_b^2}}$$

wherein $\rho_w$, $\rho_b$, $\sigma_w$ and $\sigma_b$ are an average of higher bit, i.e., '1', an average of lower bit, i.e., '0', a standard deviation of higher bit and a standard deviation of lower bit, respectively. The SNR to BER characteristic of the 3:4 channel decoding algorithm in accordance with the present invention is comparatively good.

Figure 4:
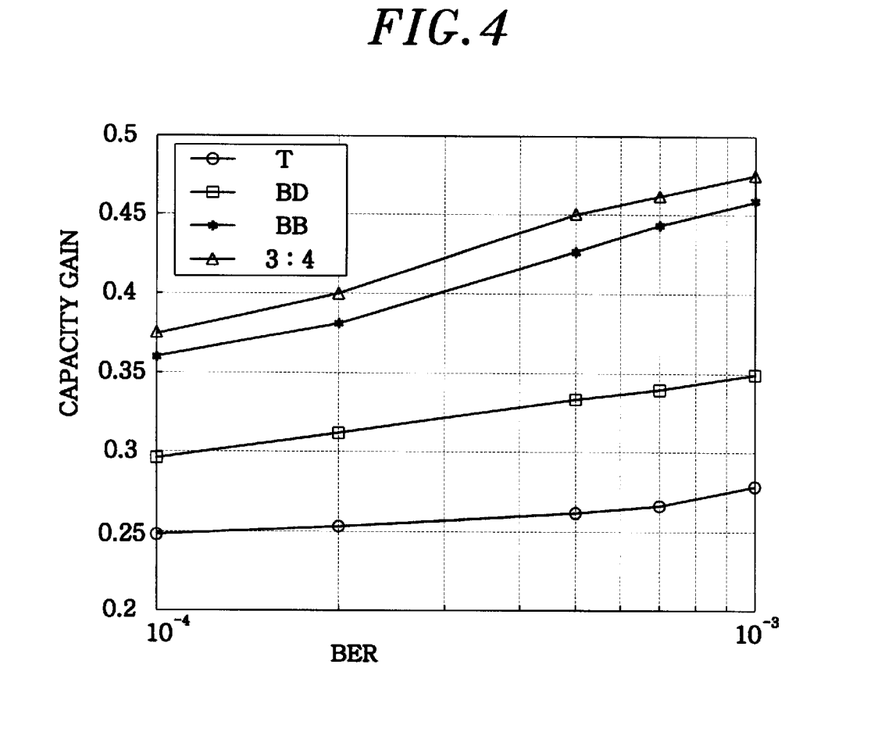
FIG. 4 presents a graph for relations between BER and capacity gain of various channel decoding algorithms.

Referring to FIG. 4, there is shown a graph for relations between BER and capacity gain of various channel decoding algorithms. The capacity gain is calculated as follows:

$$\text{Capacity gain} = \frac{m}{n} \frac{1}{\sqrt{SNR}}$$

wherein m/n is code rate and m is larger than n. The capacity characteristic of the present invention is superior to those of the other decoding algorithm.

EXAMPLE 1

3:4 Channel Coding

In 3:4 channel coding algorithm, each binary message 3-tuple is encoded with its corresponding binary codeword 4-tuple to be transmitted through a channel. Each transmitted codeword 4-tuple is received not as 4 binaries but as 4 decimals and is reconstructed as a reconstructed binary codeword 4-tuple by using a variation technique in accordance with the present invention.

Generally, 16(=$2^4$) binary codeword 4-tuples are classified 5 subsets of binary codeword 4-tuples based on the number of lower bit, i.e., 0 or higher bit, i.e., 1 within each binary codeword 4-tuple as following:

| Subset | Number of higher bit | Number of cases | Example |
|---|---|---|---|
| $G_0$ | 0 | $_4C_0 = 1$ | 0000 |
| $G_1$ | 1 | $_4C_1 = 4$ | 0001, 0010, 0100, 1000 |
| $G_2$ | 2 | $_4C_2 = 6$ | 0011, 0101, 1001, 0110, 1010, 1100 |
| $G_3$ | 3 | $_4C_3 = 4$ | 0111, 1011, 1101, 1110 |
| $G_4$ | 4 | $_4C_4 = 1$ | 1111 |

In order to represent 8 binary message 3-tuples, two subsets of binary codeword 4-tuples may be preferably selected. For example, 4 binary codeword 4-tuples in the group A (subset $G_1$) and 4 binary codeword 4-tuples in the group B (subset $G_3$) could may be used in the 3:4 channel coding. One-to-one assignment between 8 binary message 3-tuples and 8 binary codeword 4-tuples, is as following:

| Group | Feature in message 3-tuple | Message 3-tuple | Codeword 4-tuple |
|---|---|---|---|
| Group A (= subset $G_1$) | None '1' | 000 | 0001 |
| | One '1' | 001 | 0010 |
| | | 010 | 0100 |
| | | 100 | 1000 |
| Group B (= subset $G_3$) | Two '1's | 011 | 0111 |
| | | 101 | 1011 |
| | | 110 | 1101 |
| | Three '1's | 111 | 1110 |

In the group A, '1' is attached as the last, i.e., 4th bit for one binary message 3-tuple '000' which has no higher bit, i.e., '1'; and '0' is attached as the last bit for 3 binary message 3-tuples '001', '010' and '100' which have one higher bit. In the group B, '1' is attached as the last bit for 3 binary message 3-tuples '011', '101' and '110' which have two higher bits; and '0' is attached the last bit for one binary message 3-tuple '111' which has three higher bits. The assignment can be accomplished via the lookup table as illustrated above.

In the encoding mode, an input binary message is sequentially divided into a plurality of binary message 3-tuples; the binary message 3-tuples are sequentially matched with their corresponding codeword 4-tuples based on the look-up table; and those codeword 4-tuples are encoded on a recording media.

In the decoding mode, each codeword 4-tuple is reproduced not as 4 bits but as 4 decimals. In other words, an intensity of each element in the codeword 4-tuple is represented as a decimal which is equal to or larger than 0 and is equal to or smaller than 1. The intensity of each element may be doubled for an improved categorization as illustrated below.

Since M(=2) subsets of codeword 4-tuples are used so that the ceiling of $Log_2M$, i.e., $\lceil Log_2M \rceil$, is 1 and the least number L of higher bits in 2 subsets of codeword 4-tuples is 1, the greatest number K is defined as 1. Therefore, a maximum or a minimum decimal in each codeword 4-tuple is removed and, then, a variation for 3 remaining decimals is calculated. In case of removing a maximum decimal, 3 remaining decimals for representing three '0's remain in the group A, while 3 remaining decimals for representing one '0' and two '1's remain in the group B, so that the variation for each codeword 4-tuple in the group A must be smaller than that for each codeword 4-tuple in the group B. In case of removing a minimum decimal, 3 remaining decimals for representing two '0's and one '1' remain in the group A, while remaining 3 decimals for representing three '1's remain in the group B, so that the variation of each codeword 4-tuple in the group A must be Larger than that of each codeword 4-tuple in the group B. Accordingly, it may be determined whether the codeword 4-tuple belongs to the group A or the group B based on the comparison of the variation with an average variation, wherein the average variation is an average of all the variations for all codeword 4-tuples.

If a codeword 4-tuple is determined to belong to the group A, one maximum decimal is converted as '1' while 3 remaining decimals are converted as '0'. If the codeword 4-tuple is determined to the group B, one minimum decimal is converted as '0' while 3 remaining decimals are converted as '1'. After a reconstructed codeword 4-tuple is generated as described above, the deletion of the fourth bit in the reconstructed codeword 4-tuple results in the decoded message 3-tuple.

Assume that two consecutive codeword 4-tuples are reproduced as $C_1=(0.1, 0.5, 0.3, 0.2)$ and $C_2=(0.7, 0.1, 0.6, 0.5)$ for illustration. After two maximum decimals 0.5 and 0.7 in $C_1$ and $C_2$ are deleted, respectively, (0.1, 0.3, 0.2) in $C_1$ and (0.1, 0.6, 0.5) in $C_2$ remained. Since two variations for the two consecutive codeword 4-tuples $C_1$ and $C_2$ and an average variation of the two variations are $0.02(=(0.1-0.2)^2+(0.3-0.2)^2+(0.2-0.2)^2)$, $0.14(=(0.1-0.4)^2+(0.6-0.4)^2+(0.5-0.4)^2)$ and $0.08(=(0.02+0.14)/2)$, respectively, the first codeword 4-tuple $C_1$ may be defined as the group A while the second codeword 4-tuple $C_2$ may be defined as the group B. Therefore, $C_1$ and $C_2$ can be reconstructed as (0, 1, 0, 0) and (1, 0, 1, 1), respectively, and, after deleting their 4th bits, i.e., 0 and 1, respectively, two original messages 010 and 101 can be reconstructed.

EXAMPLE 2

4:5 Channel Coding

In 4:5 channel coding algorithm, each binary message 4-tuple are encoded with its corresponding binary codeword 5-tuple. Even if the binary codeword 5-tuple is generally reproduced not as 5 binaries but as 5 decimals because of inevitable noises, e.g., a detection error, a channel error and etc, it may be reconstructed as a reconstructed binary codeword 5-tuple by using a variation technique in accordance with the present invention.

Generally, $32(=2^5)$ binary 5-tuples are classified into 6 subsets of binary codeword 5-tuples, based on the number of lower bit, i.e., 0, or higher bit, i.e., 1, therein as following:

| Subset | Number of higher bit | Number of cases | Example |
|---|---|---|---|
| $G_0$ | 0 | $_5C_0 = 1$ | 00000 |
| $G_1$ | 1 | $_5C_1 = 5$ | 00001, 00010, 00100, 01000, 10000 |
| $G_2$ | 2 | $_5C_2 = 10$ | 00011, 00101, 01001, 10001, 00110 01010, 10010, 01100, 10100, 11000 |
| $G_3$ | 3 | $_5C_3 = 10$ | 00111, 01011, 10011, 01101, 10101 11001, 01110, 10110, 11010, 11100 |
| $G_4$ | 4 | $_5C_4 = 5$ | 01111, 10111, 11011, 11101, 11110 |
| $G_5$ | 5 | $_5C_5 = 1$ | 11111 |

In order to represent $2^4(=16)$ binary message 4-tuples, two subset of 32 binary codeword 5-tuples could be preferably selected. For example, 8 binary codeword 5-tuples in the subset $G_2$ and 8 binary codeword 5-tuples in the subset $G_3$ could be used in the 4:5 channel coding. One-to-one assignment between 16 binary message 4-tuples and 16 binary codeword 5-tuples was as following:

| Group | Feature in message 4-tuple | Message 4-tuple | Codeword 5-tuple |
|---|---|---|---|
| Group A (= subset $G_2$) | None '1' | 0000 | 11000 |
| | One '1' | 0001 | 00011 |
| | | 0010 | 00101 |
| | | 0100 | 01001 |
| | | 1000 | 10001 |
| | Two '1's and first '0' | 0011 | 00110 |
| | | 0110 | 01100 |
| | | 0101 | 01010 |
| Group B (= subset $G_3$) | Two '1's and first '1' | 1001 | 10011 |
| | | 1010 | 10101 |
| | | 1100 | 11001 |
| | Three '1's | 0111 | 01110 |
| | | 1011 | 10110 |
| | | 1101 | 11010 |
| | | 1110 | 11100 |
| | Four '1's | 1111 | 00111 |

The group A has 8 message 4-tuples, i.e., '0000', '0001', '0010', '0100', '1000', '0011', '0110' and '0101'. First, '0000', i.e., one message 4-tuple having no '1' is encoded into '11000'. For four message 4-tuples '0001', '0010', '0100' and '1000' which have only one higher bit '1', one higher bit '1' is attached as a last, i.e., 5th bit. For three message 4-tuples '0011', '0110' and '0101' which have two '1's and whose first bits are '0', one lower bit '0' is attached as the last bit. Accordingly, all of 8 message 4-tuples in the group A are encoded with 8 codeword 5-tuples in the subset $G_2$ with three '0's and two '1's, respectively.

In the meantime, the group B has the remaining 8 message 4-tuples, i.e., '1001', '1010', '1100', '0111', '1011', '1101', '1110' and '1111'. For three message 4-tuples '1001', '1010' and '1100' which have two '1's and whose first bits are '1', one higher bit '1' is attached as the last bit. For four message 4-tuples '0111', '1011', '1101' and '1110' which have three higher bits, one lower bit '0' is attached as a last, i.e., 5th bit. Finally, the last message 4-tuple '1111' is encoded with '00111'. Accordingly, all of 8 message 4-tuples in the group B are encoded with 8 codeword 5-tuples in the subset $G_3$ with two '0's and three '1's, respectively. Those assignments can be accomplished via the look-up table as illustrated above.

In the decoding mode, each codeword 5-tuple is reproduced not as 5 bits but as 5 decimals. In other words, an intensity of each element in the codeword 5-tuple is represented as a decimal which is equal to or larger than 0 and is equal to or smaller than 1.

Since $M(=2)$ subsets of codeword 5-tuples are used so that the ceiling of $Log_2M$, i.e., $\lceil Log_2M \rceil$, is 1 and the least number L of higher bits in 2 subsets of codeword 5-tuples is 2, the greatest number K is defined as 2. After two maximum or minimum decimals in each codeword 5-tuple are removed, a variation for the remaining decimals is calculated. In case of removing two maximum decimals, 3 remaining decimals for each codeword 5-tuple within the group A represent three '0's, while 3 remaining decimals for each codeword 5-tuple within the group B represent two '0' and one '1', so that the variation of the 3 remaining decimals for each codeword 5-tuple in the group A must be smaller than that for each codeword 5-tuple in the group B. In case of removing two minimum decimals, 3 remaining decimals for each codeword 5-tuple within the group A represent two '0's and one '1', while remaining 3 decimals for each codeword 5-tuple in the group B represent three '1's, so that the variation of the 3 remaining decimals for each codeword 5-tuple in the group A must be larger than that for each codeword 5-tuple in the group B. Accordingly, it may be determined whether the codeword 5-tuple belongs to the group A or B based on the comparison of the variation of 3 remaining decimals with an average variation, wherein the average variation is an average of all the variations of 3 remaining decimals for all is codeword 5-tuples.

If a codeword 5-tuple is determined to belong to the group A, two maximum decimals are converted as '1' while the three remaining decimals are converted as '0'. If the codeword 5-tuple is determined to belong to the group B, two minimum decimals are converted as '0' while three remaining decimals are converted as '1'. After a reconstructed codeword 5-tuple is generated as described above, a decoded message 4-tuple can be generated based on the look-up table.

Assume that two consecutive codeword 5-tuples are reproduced as $C_3=(0.1, 0.5, 0.3, 0.2, 0.4)$ and $C_4=(0.7, 0.1, 0.6, 0.5, 0.3)$ for illustration. After two maximum decimals 0.5 and 0.4 in $C_3$ and two maximum decimals 0.7 and 0.6 are deleted, $(0.1, 0.3, 0.2)$ in $C_3$ and $(0.1, 0.5, 0.3)$ in $C_4$ are remained. Since two variations of the 3 remaining decimals for the two consecutive codeword 5-tuples $C_3$ and $C_4$ and an average variation of the two variations are $0.02(=(0.1-0.2)^2+(0.3-0.2)^2+(0.2-0.2)^2)$, $0.08(=(0.1-0.3)^2+(0.5-0.3)^2(0.3-0.3)^2)$ and $0.05(=(0.02+0.08)/2)$, the third codeword 5-tuple $C_3$ may be defined as the group A while the fourth codeword 5-tuple $C_4$ may be defined as the group B. Therefore, $C_3$ and $C_4$ can be reconstructed as $(0, 1, 0, 0, 1)$ and $(1, 0, 1, 1, 0)$ and, after deleting their 5th bits, i.e., 1 and 0, respectively, two original messagee '0100' and '1011' can be reconstructed.

EXAMPLE 3

Another 4:5 Channel Coding

In order to represent $2^4(=16)$ binary message 4-tuples, 4 subsets of binary codeword 5-tuples may be preferably selected. For example, 4 binary codeword 5-tuples in the subset $G_1$, 4 binary codeword 5-tuples in the subset $G_2$, 4 binary codeword 5-tuples in the subset $G_3$, and 4 binary codeword 5-tuples in the subset $G_4$ will be used in another 4:5 channel coding. One-to-one assignment between 16 binary message 4-tuples and 16 binary codeword 5-tuples is as following:

| Group | Feature in message 4-tuple | Message 4-tuple | Codeword 5-tuple |
| --- | --- | --- | --- |
| Group A (= subset $G_1$) | None '1' | 0000 | 00001 |
| | One '1' and first '0' | 0001 | 00010 |
| | | 0010 | 00100 |
| | | 0100 | 01000 |
| Group B (= subset $G_2$) | One '1' and first '1' | 1000 | 10001 |
| | Two '1's and first '0' | 0011 | 00110 |
| | | 0101 | 01010 |
| | | 0110 | 01100 |
| Group C (= subset $G_3$) | Two '1's and first '1' | 1001 | 10011 |
| | | 1010 | 10101 |
| | | 1100 | 11001 |
| | Three '1's and first '0' | 0111 | 01110 |
| Group D (= subset $G_4$) | Three '1's and first '1' | 1011 | 10111 |
| | | 1101 | 11011 |
| | | 1110 | 11101 |
| | Four '1's | 1111 | 11110 |

Groups A, B, C and D correspond to 4 sets of 4 message 4-tuples, i.e., {'0000', '0001', '0010' and '0100'}, {'1000', '0011', '0110' and '0101'}, {'1001', '1010', '1100' and '0111'} and {'1011', '1101', '1110' and '1111'}, respectively. First, '0000', and '1111' are encoded into '00001' and '11110', respectively. In the meantime, the remaining message 4-tuples are encoded as following: if the first bit of a message 4-tuple is '0', one lower bit '0' is attached as the 5th bit and, if otherwise, one higher bit '1' is attached as the 5th bit. Those assignments can be accomplished via the look-up table as illustrated above.

In the decoding mode, each codeword 5-tuple is reproduced not as 5 bits but as 5 decimals. Since M(=4) subsets of codeword 5-tuples are used so that the ceiling of $Log_2M$, i.e., $\lceil Log_2M \rceil$, is 2 and the least number L of higher bits in 4 subsets of codeword 5-tuples is 1, the greatest number K is defined as 2. After two maximum or minimum decimals in each codeword 5-tuple are removed, a variation for the 3 remaining decimals is calculated. In case of removing two maximum decimals, 3 remaining decimals for each codeword 5-tuple within the group (A or B) represent three '0's, while 3 remaining decimals for each codeword 5-tuple within the group (C or D) have one or two decimals for representing one or two '1's, so that the variation of the 3 remaining decimals for each codeword 5-tuple in the group (A or B) must be smaller than that for each codeword 5-tuple in the group (C or D). In case of removing two minimum decimals, the 3 remaining decimals for each codeword 5-tuple within the group (A or B) have one or two decimals for representing one or two '1's, while remaining 3 decimals for each codeword 5-tuple in the group (C or D) represent three '1's, so that the variation of the 3 remaining decimals for each codeword 5-tuple in the group (A or B) must be larger than that for each codeword 5-tuple in the group (C or D). Accordingly, it may be determined whether the codeword 5-tuple belongs to the group (A or B) or group (C or D) based on the comparison of the variation of the 3 remaining decimals with an average variation.

In order to further separate the group (A or B) and the group (C or D), another variation comparison process as will be described below is required. Since $Log_2M-1(=1)$ is larger than 0 and $L-1(=0)$ is equal to or larger than 0, the greatest number K is reassigned as 1. After one maximum or minimum decimal in each codeword 5-tuple is removed, a variation for the 4 remaining decimals is calculated. If the codeword 5-tuple is determined to belong to the group (A or B), one maximum decimal is preferably removed and, if otherwise, one minimum decimal is preferably removed.

In case of removing one maximum decimal, 4 remaining decimals for each codeword 5-tuple within the group A represent four '0's, while 4 remaining decimals for each codeword 5-tuple within the group B represent three '0's and one '1', so that the variation of the 4 remaining decimals for each codeword 5-tuple in the group A must be smaller than that for each codeword 5-tuple in the group B. Accordingly, it may be determined whether the codeword 5-tuple belongs to the group A or the group B based on the comparison of the variation of the 4 remaining decimals with an average variation.

In case of removing one minimum decimal, 4 remaining decimals for each codeword 5-tuple within the group C represent one '0' and three '1's, while remaining 4 decimals for each codeword 5-tuple in the group D represent four '1's, so that the variation of the 4 remaining decimals for each codeword 5-tuple in the group C must be larger than that for each codeword 5-tuple in the group D. Accordingly, it may be determined whether the codeword 5-tuple belongs to the group C or the group D based on the comparison of the variation of the 4 remaining decimals with an average variation.

If the codeword 5-tuple is determined to belong to the group A, only one maximum decimal is converted as '1' while four remaining decimals are corverted as '0'. If the codeword 5-tuple is determined to belong to the group B, two maximum decimals are converted as '1' while three remaining decimals are converted as '0'. If the codeword 5-tuple is determined Lo belong to the group C, two minimum decimals are converted as '0' while 3 remaining decimals are converted as '1'. If the codeword 5-tuple is determined to belong to the group D, one minimum decimal is converted as '0' while the four remaining decimals are converted as '1'. After a reconstructed codeword 5-tuple is generated as described above, a decoded message 4-tuple can be generated based on the look-up table.

While the invention has been shown and described with respect to the preferred embodiments, it will be understood by those skilled in the art that various changes and modifications may be made without departing from the spirit and scope of the invention as defined in the following claims.

What is claimed is:

1. A method for mapping $2^N$ message N-tuples into $2^{N+1}$ codeword (N+1)-tuples, wherein each of said N-tuples and (N+1)-tuples is a binary code comprised of bits, 0 and 1, comprising the steps of:

(a) categorizing the $2^{N+1}$ codeword (N+1)-tuples into M subsets of codeword (N+1)-tuples, wherein M is an integer larger than 1, each subset G has $N_G$ codeword (N+1)-tuples, $N_G$ being a positive integer, and the total number of codeword (N+1)-tuples in the M subsets is $2^N$ given as follows:

$$\sum_{G=1}^{M} N_G = 2^N,$$

wherein said each subset G has a predetermined number $K_G$ of lower bits and a predetermined number $(N+1-K_G)$ of higher bits and the number of lower bits in every codeword (N+1)-tuple in any subset is not equivalent to that of lower bits in every codeword (N+1)-tuple in any other sutset; and (b) matching said $2^N$ message N-tuples with said $2^N$ codeword (N+1)-tuples in said M subsets, respectively, in one-to-one correspondence to generate a lookup table.

2. The method of claim 1, further comprising the steps of:

(c) dividing an input message into a plurality of message N-tuples; and (d) encoding each message N-tuple in said plurality of message N-tuples with its corresponding codeword (N+1)-tuple based on the lookup table sequentially.

3. The method of claim 1, further comprising the step of:

(f) decoding a plurality of transmitted codeword (N+1)-tuples to reconstruct their corresponding reconstructed message N-tuples based on the lookup table, wherein each transmitted codeword (N+1)-tuple is represented by (N+1) decimals.

4. The method of claim 3, wherein the step (f) includes the steps of:

(f1) receiving said each trasmitted codeword (N+1)-tuple as the (N+1) decimals;

(f2) calculating a dispersion for said each transmitted codeword (N+1)-tuple to compare said dispersion for said each transmitted codeword (N+1)-tuple with an average dispersion, wherein the average dispersion is an average of dispersions for said plurality of transmitted codeword (N+1)-tuples;

(f3) determining which subset G corresponds to said each transmitted codeword (N+1)-tuple based on the dispersion comparison result;

(f4) converting a predetermined number $K_G$ of lower decimals in said each transmitted codeword (N+1)-tuple into the lower bit and a predetermined number $(N+1-K_G)$ of higher decimals into the higher bit to reconstruct a reconstructed codeword (N+1)-tuple; and (f5) assigning to said reconstructed codeword (N+1)-tuple a reconstructed message N-tuple based on the lookup table.

5. The method of claim 4, wherein the step (f2) has the steps of:

(f21) estimating a least number L of higher and lower bits in said M subsets of codeword (N+1)-tuples, L being an integer;

(f22) computing a greatest number K from the least number L and the subset number M, K being an integer;

(f23) deleting maximum or minimum decimals as many as the greatest number K in the (N+1) decimals to obtain (N+1−K) decimals;

(f24) evaluating an (N+1−K)th dispersion for the (N+1−K) decimals;

(f25) comparing the (N+1−K)th dispersion with an (N+1−K)th average dispersion which is an average of dispersions for the plurality of transmitted codeword (N+1)-tuples; and (f26) decreasing $\text{Log}_2 M$ and the least number L by 1 and performing steps (f22) to (f25) until $\text{Log}_2 M$ is equal to or smaller than 0 or the least number L is smaller than 0.

6. The method of claim 5, wherein the greatest number K is a maximum value of the least number L and $\lceil \text{Log}_2 M \rceil$, wherein $\lceil \text{Log}_2 M \rceil$ is a smallest integer that is not smaller than $\text{Log}_2 M$.

7. The method of claim 1, wherein $N_G$ is equal to $2^{N+1}/M$.

8. The method of claim 1, wherein M is an even integer.

9. An apparatus for mapping $2^N$ message N-tuples into $2^{+1}$ codeword (N+1)-tuples, wherein each of said N-tuples and (N+1)-tuples is a binary code comprised of bits, 0 and 1, comprising:

means for categorizing the $2^{N+1}$ codeword (N+1)-tuples into M subsets of codeword (N+1)-tuples, wherein M is an integer larger than 1, each group G has $N_G$ codeword (N+1)-tuples, $N_G$ being a positive integer, and the total number of codeword (N+1)-tuples in said M subsets is $2^N$ given as follows:

$$\sum_{G=1}^{M} N_G = 2^N,$$

wherein said each subset G has a predetermined number $K_G$ of lower bits and a predetermined number $(N+1-K_G)$ of higher bits and the number of lower bits in every codeword (N+1)-tuple in any subset is not equivalent to that of lower bits in every codeword (N+1)-tuple in any other subset; and means for matching said $2^N$ message N-tuples with said $2^N$ codeword (N+1)-tuples in said M subsets, respectively, in one-to-one correspondence to generate a lookup table.

10. The apparatus of claim 9, further comprising:

means for dividing an input message into a plurality of message N-tuples; and means for encoding each message N-tuple in said plurality of message N-tuples with its corresponding codeword (N+1)-tuple based on the lookup table sequentially.

11. The apparatus of claim 9, further comprising:

means for decoding a plurality of transmitted codeword (N+1)-tuples to reconstruct their corresponding reconstructed message N-tuples based on the lookup table, wherein each transmitted codeword (N+1)-tuple is represented by (N+1) decimals.

12. The apparatus of claim 11, wherein the decoding means includes:

means for receiving said each transmitted codeword (N+1)-tuple as the (N+1) decimals;

means for calculating a dispersion for said each transmitted codeword (N+1)-tuple to compare said dispersion for said each transmitted codeword (N+1)-tuple with an average dispersion, wherein the average dispersion is an average of dispersions for said plurality of transmitted codeword (N+1)-tuples;

means for determining which subset G corresponds to said each transmitted codeword (N+1)-tuple based on the dispersion comparison result;

means for converting a predetermined number $K_G$ of lower decimals in said each transmitted codeword (N+1)-tuple into the lower bit and a predetermined number (N+1−$K_G$) of higher decimals into the higher bit to form a reconstructed codeword (N+1)-tuple; and means for assigning to said reconstructed codeword (N+1)-tuple a reconstructed message N-tuple based on the lookup table.

13. The apparatus of claim 12, wherein the calculating means has:

means for estimating a least number L of higher and lower bits in said M subsets of codeword (N+1)-tuples, L being an integer;

means for computing a greatest number K from the least number L and the subset number M, K being an integer;

means for deleting maximum or minimum decimals as many as the greatest number K in the (N+1) decimals to obtain (N+1−K) decimals;

mean for evaluating for an (N+1−K)th dispersion for the (N+1−K) decimals; and means for comparing the (N+1−K)th dispersion with an (N+1−K)th average dispersion which is an average of dispersions for the plurality of transmitted codeword (N+1)-tuples.

14. The apparatus of claim 13, wherein the greatest number K is a maximum value of the least number L and $\lceil Log_2 M \rceil$, wherein $\lceil Log_2 M \rceil$ is the smallest integer that is not smaller than $Log_2 M$.

15. The apparatus of claim 9, wherein $N_G$ is equal to $2^{N+1}/M$.

16. The apparatus of claim 9, wherein M is an even integer.

* * * * *